United States Patent
Jeter et al.

(10) Patent No.: US 9,990,973 B1
(45) Date of Patent: Jun. 5, 2018

(54) SYSTEMS AND METHODS USING NEIGHBORING SAMPLE POINTS IN MEMORY SUBSYSTEM CALIBRATION

(71) Applicant: Apple Inc., Cupertino, CA (US)

(72) Inventors: Robert E. Jeter, Santa Clara, CA (US); Rakesh L. Notani, Sunnyvale, CA (US); Fabien S. Faure, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days. days.

(21) Appl. No.: 15/436,212

(22) Filed: Feb. 17, 2017

(51) Int. Cl.
    *G11C 7/22* (2006.01)
(52) U.S. Cl.
    CPC ................................. *G11C 7/22* (2013.01)
(58) Field of Classification Search
    CPC .................................. G11C 7/22; G11C 7/222
    USPC .................................................... 365/193, 194
    See application file for complete search history.

(56) References Cited

U.S. PATENT DOCUMENTS

| | | | | |
|---|---|---|---|---|
| 6,570,944 B2 * | 5/2003 | Best | ............... | G06F 1/10 327/161 |
| 6,600,681 B1 * | 7/2003 | Korger | ............... | G11C 7/1066 365/193 |
| 7,162,376 B2 | 1/2007 | Oh | | |
| 7,698,589 B2 * | 4/2010 | Huang | ............... | G06F 5/06 713/400 |
| 8,289,784 B2 | 10/2012 | Fox | | |
| 8,379,457 B1 * | 2/2013 | Chen | ............... | G06F 13/1689 365/185.18 |
| 8,423,813 B2 * | 4/2013 | Huang | ............... | G06F 5/06 400/503 |
| 8,508,995 B2 | 8/2013 | Weingarten | | |
| 9,666,264 B1 * | 5/2017 | Jeter | ............... | G11C 11/4076 |
| 2006/0052961 A1 * | 3/2006 | Best | ............... | G06F 13/1689 702/106 |
| 2006/0164909 A1 * | 7/2006 | Gower | ............... | G11C 7/1048 365/193 |
| 2009/0161453 A1 * | 6/2009 | Giovannini | ............... | G11C 7/1078 365/193 |
| 2013/0258788 A1 * | 10/2013 | Ide | ............... | G11C 7/10 365/189.05 |
| 2014/0177377 A1 * | 6/2014 | Kumar | ............... | G11C 29/022 365/233.12 |

(Continued)

*Primary Examiner* — Michael Tran
(74) *Attorney, Agent, or Firm* — Meyertons, Hood, Kivlin, Kowert & Goetzel, P.C.

(57) ABSTRACT

A method and apparatus for using neighboring sampling points in a memory subsystem calibration is disclosed. In one embodiment, a memory subsystem includes a memory and a memory controller coupled thereto. A calibration unit in the memory controller is configured to perform calibrations of a data strobe signal and a reference voltage to determine eye openings for signals conveyed between the memory and the memory controller. Performing the calibration includes determining a number of different calibration points and computing initial scores for each of the calibration points. The method further includes calculating adjusted scores for each calibration point. For a given calibration point, the adjusted score includes weighted values of one or more calibration points that are adjacent thereto. The method further includes selecting a calibration point having the highest adjusted score as the calibrated value.

18 Claims, 6 Drawing Sheets

(56) References Cited

U.S. PATENT DOCUMENTS

| | | | |
|---|---|---|---|
| 2014/0293718 A1* | 10/2014 | Prakash | ................ G06F 3/0418 365/193 |
| 2015/0029800 A1* | 1/2015 | Iijima | ................ H03K 19/0016 365/193 |
| 2016/0292094 A1 | 10/2016 | Jeter | |
| 2017/0169877 A1* | 6/2017 | Zerbe | ................. G11C 11/4076 |

* cited by examiner

SYSTEMS AND METHODS USING NEIGHBORING SAMPLE POINTS IN MEMORY SUBSYSTEM CALIBRATION

BACKGROUND

Technical Field

This disclosure is directed to memory subsystems, and more particularly, calibration of signals conveyed in memory subsystems.

Description of the Related Art

Eye diagrams, are graphic illustrations that illustrate times and amplitudes at which a digital signal can be sampled at its correct value. In various types of systems that include data transmissions, sampling of signals (based on a clock signal) near a center of an eye, in terms of time, may be desirable. This may provide a signal with a sufficient amount of both setup and hold time, while also rendering it less susceptible to noise. In sampling a signal, a threshold voltage is used to determine whether the signal is interpreted as a logic zero or a logic 1.

In memory systems, calibrations may be performed to determine the points at which signals are sampled within the eye opening. Calibrations may be performed to determine both the point in time at which signals are sampled, as well as to determine the threshold voltage for distinguishing between logic zero's and logic 1's. The calibration to determine the point in time at which signals are sampled may be referred to as a horizontal calibration. The calibration to determine the threshold voltage may be referred as a vertical calibration. In many memory systems, these calibrations are performed at regular intervals, and typically, in conjunction with one another.

SUMMARY

A method and apparatus for using neighboring sampling points in a memory subsystem calibration is disclosed. In one embodiment, a memory subsystem includes a memory and a memory controller coupled thereto. A calibration unit in the memory controller is configured to perform calibrations of a data strobe signal and a reference voltage to determine eye openings for signals conveyed between the memory and the memory controller. Performing the calibration includes determining a number of different vertical calibration points and computing initial scores for each of the vertical calibration points. The method further includes calculating adjusted scores (which may also be referred to as 'neighborhood' scores) for each vertical calibration point. For a given vertical calibration point, the adjusted score includes weighted values of one or more vertical calibration points that are adjacent thereto. The method further includes selecting a vertical calibration point having the highest adjusted score as the calibrated value.

In one embodiment, the calibration includes performing calibration of a delay applied to the data strobe signal (a "horizontal" calibration) and a calibration of a references voltage (a "vertical calibration) that is used to distinguish between a logic zero and a logic one. The eye opening for a given signal (e.g., a data bit conveyed between the memory and the memory controller) may include delay values and reference voltage values for which a data bit may be validly read. The initial score for a given vertical calibration point (which includes a delay value and a reference voltage value) may correspond to a width of the eye opening at that point. The adjusted score of a given vertical calibration point may depend on width and shape of vertical calibration points that are adjacent thereto (e.g., one immediately preceding, one immediately subsequent thereto). A weighted score for an adjacent vertical calibration point may be computed by multiplying its initial score by a weighting factor. The adjusted score for a given vertical calibration point may be the sum of its initial score and the weighted scores of the adjacent vertical calibration points.

BRIEF DESCRIPTION OF THE DRAWINGS

The following detailed description makes reference to the accompanying drawings, which are now briefly described.

Figure 1:
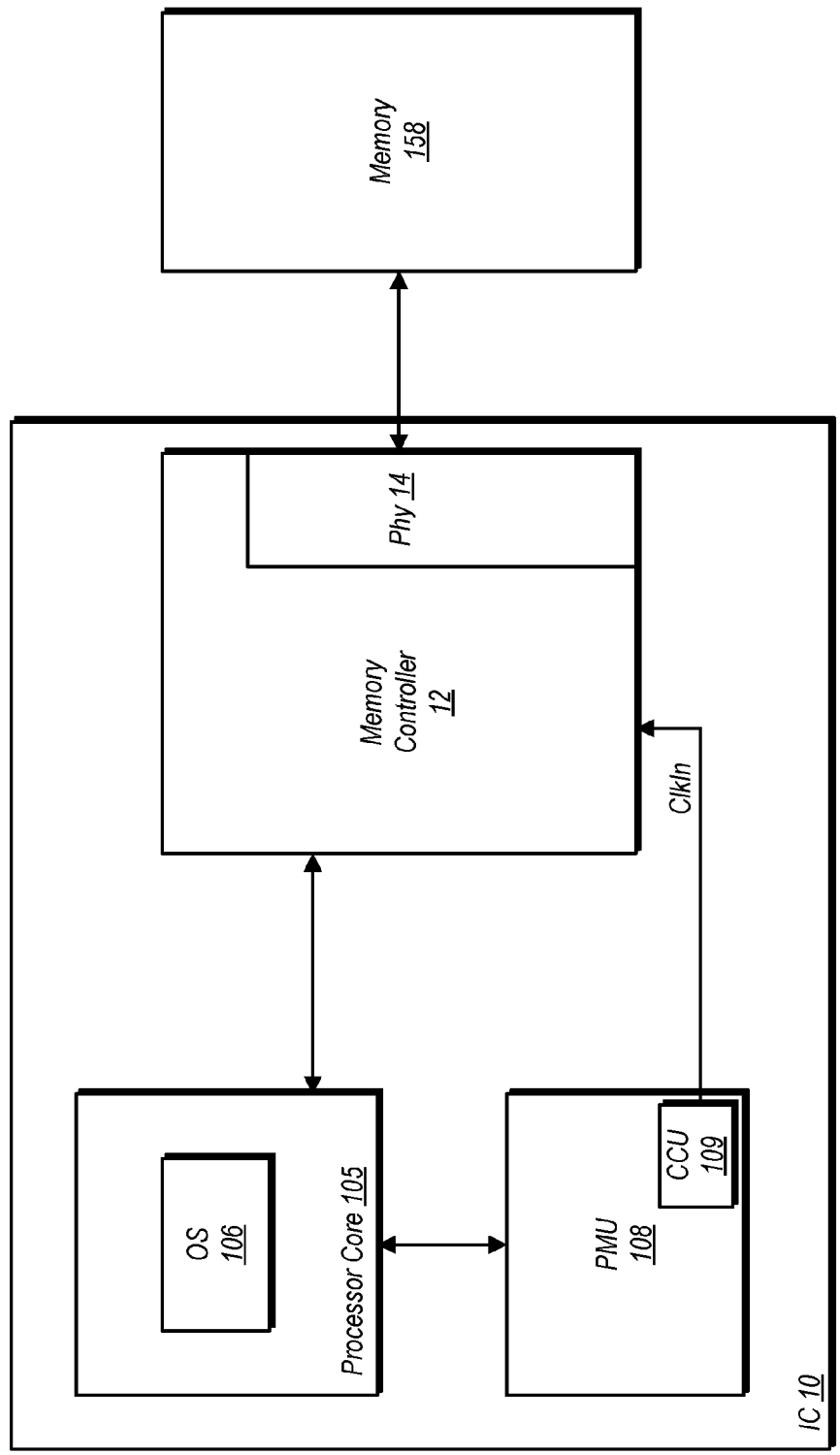
FIG. 1 is a block diagram of one embodiment of an integrated circuit and a memory coupled thereto.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation— [entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

FIG. 1 is a block diagram of one embodiment of an integrated circuit (IC). IC 10 is shown here as a simplified block diagram including various units/circuits implemented thereon. However, other embodiments are possible and contemplated, and may include additional circuits/units not shown here or explicitly discussed herein.

In the embodiment shown, IC 10 is coupled to a memory 158. In one embodiment, memory 158 is a dynamic random access memory (DRAM), although the scope of this disclosure is not limited to DRAM.

IC 10 in the embodiment shown includes at least one processor core 105, although multiple instances of the same may be present. Processor core 105 is configured to execute software instructions, including those of operating system (OS) 105. The instructions of OS 105 may when executed, cause various system management functions to be performed such as memory allocation, performance state changes, and so forth.

IC 10 also includes a power management unit (PMU) 108 in the illustrated embodiment. PMU 108 may implement circuitry that performs various power control functions, such as supply voltage changes, power gating, clock frequency changes, and clock gating. These power control functions may be performed in conjunction with performance state changes. Such performance state changes may be put into effect via execution of instructions of OS 105 or through other mechanisms within PMU 108 itself.

PMU 108 in the illustrated embodiment includes a clock control unit (CCU) 109. A clock signal, ClkIn, may be provide from CCU 109 to a memory controller 12 of IC 10. This clock signal may be generated internal to CCU 109, or by other clock generation circuitry external thereto.

Memory controller 12, which includes physical interface (PHY) 14, provides an interface between processor core 105 and memory 158. Although not explicitly shown, IC 10 may also include one or more units of interface circuitry that are also coupled to memory controller 12. Accordingly, memory controller 12 may provide an interface for one or more circuits external to IC 10 and memory 158.

Figure 2:
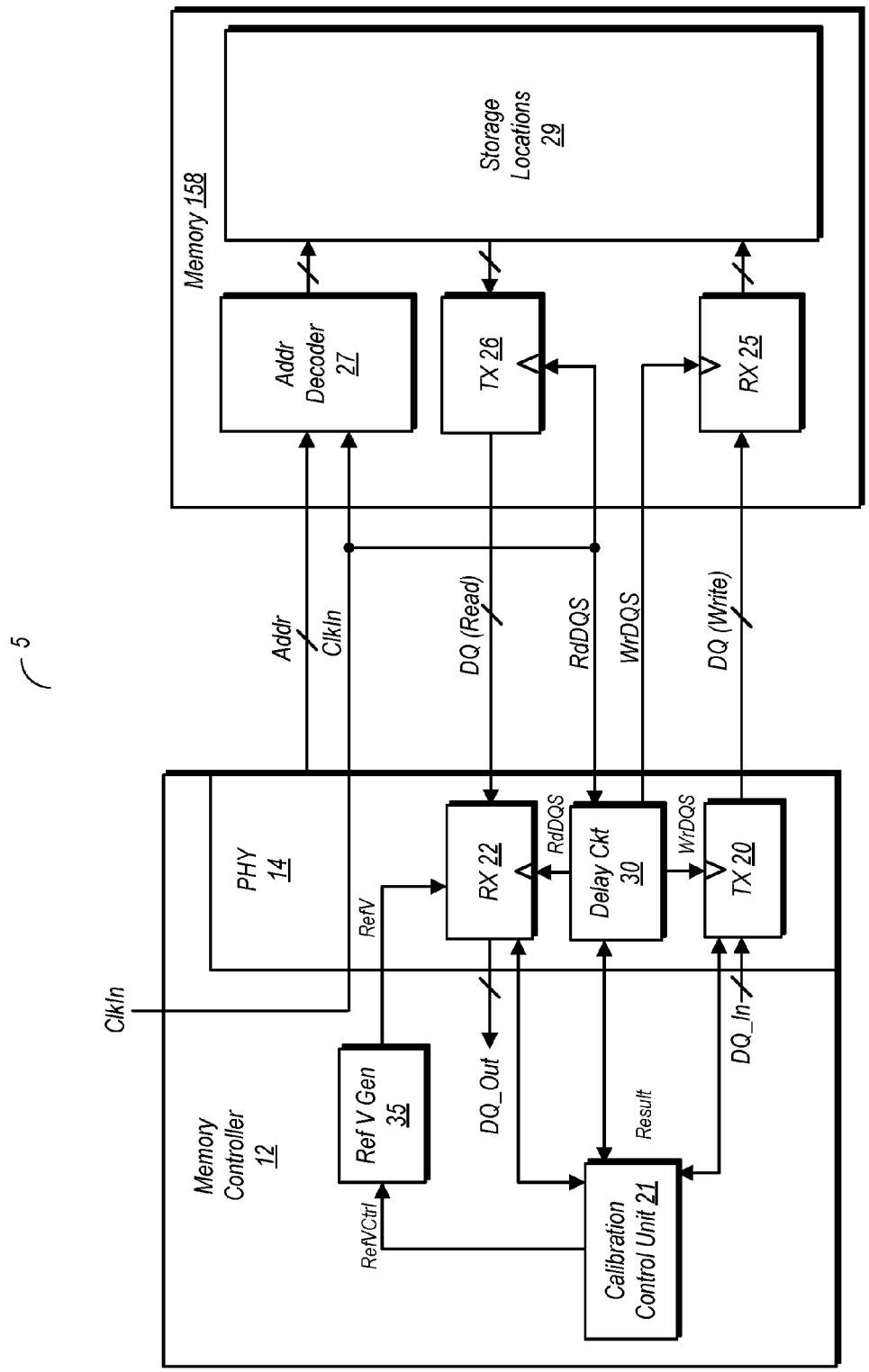
FIG. 2 is a block diagram of one embodiment of a memory subsystem.

Turning now to FIG. 2, a block diagram of a system having a memory controller and a memory is shown. In the embodiment shown, system 5 includes a memory controller 12 and a memory 158. The memory controller 12 includes a physical layer 14 which is used for interfacing with memory 158. The physical layer 14 includes a receiver 22 configured to receive data read from memory 158, and a transmitter 20 configured to transmit data to memory 158. Memory 158 includes an address decoder 27, a number of storage locations 29, a receiver 25 configured to receive data to be written and a transmitter 26 configured to transmit data that has been read. Although not explicitly shown, memory 158 may include additional logic for receiving read and write enable signals, with such logic being configured to enable selected storage locations for read and write operations, respectively. Additionally, memory controller 12 in the embodiment shown includes a calibration control unit 21, which may conduct various calibrations in the memory subsystem, as will be discussed below.

Physical layer 14 includes a delay circuit 30 that is coupled to receive an input clock signal ('ClkIn'), which is used as a basis to generate other clock signals (e.g., data strobe signals, such as the read data strobe, RdDQS) used in the memory subsystem. In the embodiment shown, delay circuit 30 may include two separate paths to apply delays to a read data strobe ('RdDQS') and a write data strobe ('WrDQS'). For example, one embodiment of delay circuit 30 may include a pair of delay locked loops (DLLs), one configured to output the read data strobe (to receiver 22) and one to output the write data strobe. The delays of the respective DLL's may be set according to control signals generated elsewhere in memory controller 12, e.g., in calibration control unit. Types of delay circuits other than DLL's are also possible and contemplated for various other embodiments. It is further noted that embodiments are possible and contemplated wherein no data strobe signal is returned to the memory controller (e.g., not returned from the memory, using an internal data strobe signal instead). Such embodiments are intended to fall within the scope of this disclosure.

Delay circuit 30 may provide a delayed version of the read data strobe to receiver 22 in physical layer 14, whereas transmitter 26 of memory 158 is coupled to receive the non-delayed version generated off of ClkIn. These read data strobe signals may be used in synchronizing reads of memory 158. The write data strobe may be provided to transmitter 20 of physical layer 14, along with receiver 25 of memory 158. Accordingly, the write data strobe may be used in synchronizing writes to memory 158.

Memory 158 in the embodiment shown includes address decoder 27, which is coupled to receive an address from physical layer 14 of memory controller 12. Address decoder 27 may decode the received address to enable particular ones of the storage locations 29 that are to be accessed for a current memory operation. Addresses may be provided from physical layer 14 of memory controller 12 for both read operation and write operations.

The data strobe signals provided by delay circuit 30 may be subject to inherent delays, particularly on the side of memory 158. Since the clock edges of the data strobe signals are used to validate data received from memory controller 12 when received by receiver 25 at memory 158, as well as to validate data transmitted from transmitter 26 of memory 158, it is important that setup and hold time requirements for both are observed. Moreover, the data strobe signals used herein are used to synchronize the sampling of multiple bits. Furthermore, the signal paths for conveying bits between memory controller 12 and memory 158 may each be subject to their own unique delays, and thus some inter-lane skew may be present among the data bits. It is desirable that each data signal be sampled at or near the center of a window that may be depicted by an eye diagram. Accordingly, calibration procedures may be performed at certain times during operation of memory controller 12 in order to optimize the point in time at which the data strobe signals sample data and involve performing a number of reads of from memory along with adjustments of an amount of delay applied to the data strobe signal being calibrated. The calibration of the data strobe delay may be performed periodically, and may sometimes be referred to as a horizontal calibration.

A reference voltage calibration may also be performed under the control of calibration control unit 21. The reference voltage may be that voltage which is used to distinguish between a logic zero and a logic 1. Over time, due to process, voltage, and temperature variations, the reference voltage may need to be calibrated. This calibration may also be performed periodically, and may sometimes be referred to as a vertical calibration. Based on the calibration, calibration control unit may set the reference voltage at reference voltage generator 35 using the signal RefVCtrl. The reference voltage, RefV, or an indication of the same, may be provided from reference voltage generator 35 to receiver 22.

The calibration procedures may be conducted under the control of calibration control unit 21. A calibration includes performing multiple iterations of writing data to memory, reading the data back from memory, and comparing the read data to the written data. Writes and reads of data for calibrating the data strobe delay may include performing writes and reads at number of different delay values. Writes and reads for calibrating the reference voltage may include performing a number of different writes and reads at different reference voltage values.

Upon performing a calibration, calibration control unit 21 may determine the parameters of an eye opening based on the calibrated values of the data strobe delay and the reference voltage. As the data bus (DQ) has a number of bit positions from which data is received and read, the parameters of an eye opening may be determined for each. Accordingly, calibration control unit 21 includes functionality (e.g., circuitry) for determining an eye opening for each bit position during each iteration of a performed calibration. When utilizing information based on an eye opening calibration control unit 21 may, in one embodiment, rely on an average eye opening for all bits. In another embodiment, calibration control unit 21 may rely on a bit having the smallest eye opening as a basis for further operations.

In one embodiment, the horizontal and vertical calibrations may be performed at the same periodic intervals (it is noted that a vertical calibration is essentially a series of horizontal calibrations at different reference voltage values). Performing the vertical calibrations may include determining a number of vertical calibration points. The result of each vertical calibration point is a range of delay values at which data may be correctly read or written. For each vertical calibration point, an initial score may be calibrated based on the horizontal width of the eye (which may be, e.g., an average width for all bits, a minimum width, etc.). Furthermore, as explained below, CCU 21 may be configured to compute adjusted scores for each vertical calibration point. In computing an adjusted score for a given vertical calibration point, one or more neighboring vertical calibration points may be weighted and combined with the initial score for the given vertical calibration point.

A neighboring vertical calibration point may be one that is close, in terms of reference voltage, to the given vertical calibration point. Using exemplary values, if a given vertical calibration point has a value of 450 mV (millivolts), immediately adjacent neighbors may be present at 425 mV and 475 mV (given a 25 mV step size in the voltages at which calibrations are conducted). In computing an adjusted score, the initial score for the given vertical calibration point may be weighted using the initial scores of one or more neighbor vertical calibration points. In one embodiment, the adjusted score for vertical calibration points that are not on the extreme ends may be weighted by use the scores of the immediately preceding and immediately following vertical calibration points. For a vertical calibration point on the lower extreme (i.e. smallest reference voltage), the score for the immediately following neighbor may be used to determine the adjusted score. For a vertical calibration point on the upper extreme (i.e. largest reference voltage), the score for the immediately preceding neighbor may be used to determine its adjusted score. However, embodiments falling within the scope of this disclosure are not limited to using only scores from immediately adjacent neighbor calibration points in determining a neighborhood score for a given vertical calibration point. Instead, embodiments are possible and contemplated in which scores from a number of vertical calibration points (e.g., two immediately preceding, two immediately following) are used in determining a neighborhood score, with the weighting factors adjusted depending on the distance from the vertical calibration point for which the adjusted score is being calculated. The calibrations performed by CCU 21 in the embodiment shown may conclude by selecting a vertical calibration point with the highest adjusted score as the new operating point. Further details are discussed below.

Figure 3:
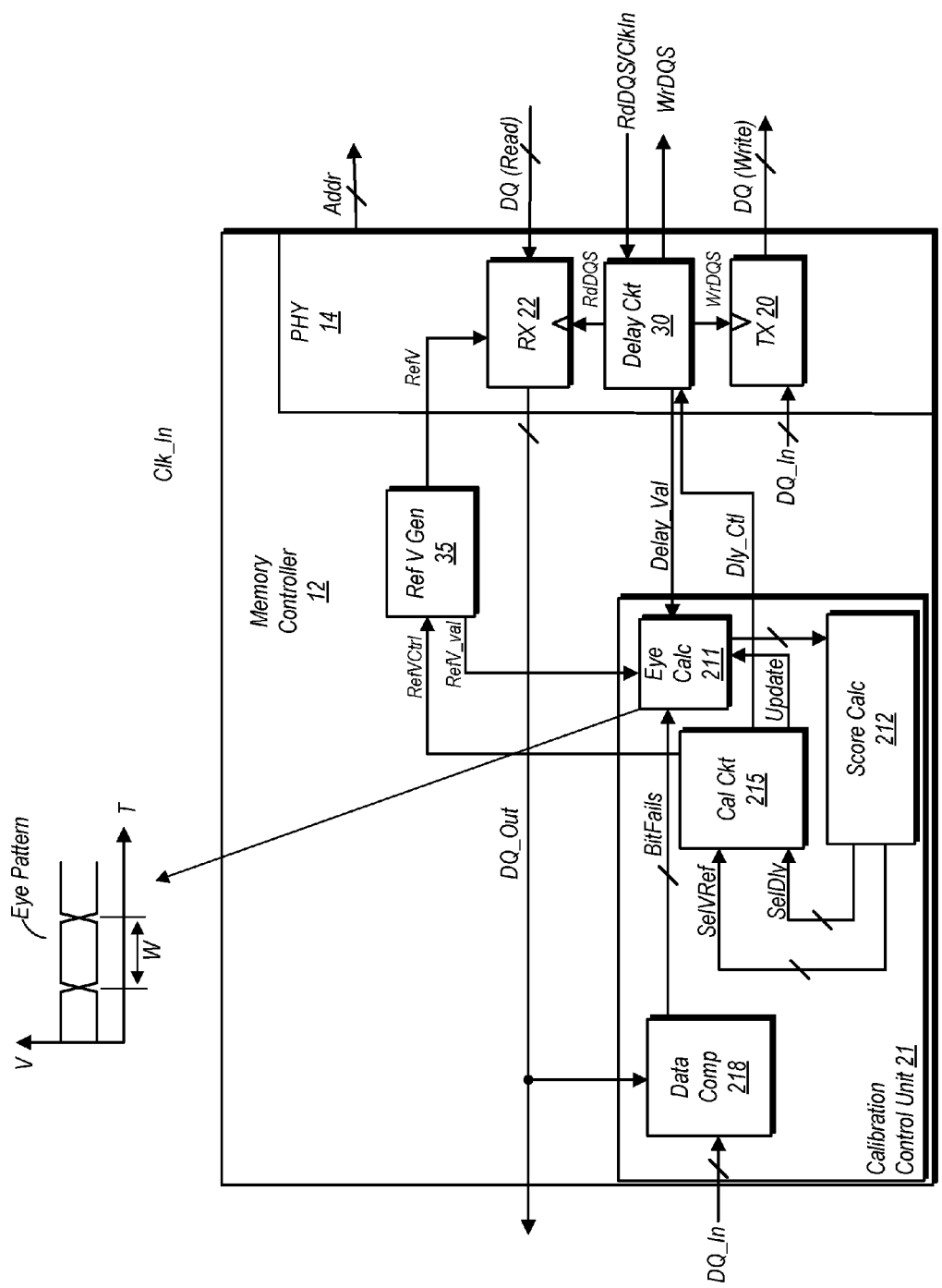
FIG. 3 is a block diagram illustrating one embodiment of a memory controller having a calibration control unit.

FIG. 3 further illustrates one embodiment of a memory controller having a calibration control unit. In the embodiment shown, calibration control unit includes a calibration circuit 215, an eye calculation circuit 211, a score calculation circuit 212, and a data comparison circuit 218.

During calibration operations, the data comparison circuit 218 may receive data that is to be written to the memory via the DQ_In input. Data that is read from memory may be received by data comparison circuit 218 from receiver 22, via the DQ_Out path. The data read from memory may then be compared to data that was written to determine if any bit fails (i.e. bits in particular positions in which the read data and write data do not match in logical value). Bit fails ('BitFails' as shown in the drawing), may be reported to eye calculation circuit 211 as they occur. Responsive to receiving information of a bit fail, eye calculation circuit 211 may record the failing bit along with the reference voltage value and the delay value (as applied to the data strobe). Based on the data from failing bits and corresponding reference voltage and delay values, eye calculation circuit 211 may calculate the horizontal width of the eye opening at the particular vertical calibration point (i.e. at the delay value). For each vertical calibration point, the horizontal width of the eye opening at a given calibration point may be forwarded to score calculation circuit 212.

The score calculation circuit 212 may calculate both initial scores and adjusted scores for each of the calibration points. As previously noted, the initial score for each vertical calibration point is based on a horizontal width of the eye at a particular reference voltage. The adjusted score for a given vertical calibration point may be determined by weighting the initial score with the scores of neighboring vertical calibration points (e.g., two adjacent neighbors, one preceding and one following). In one embodiment, the adjusted (or neighborhood) score for a given calibration point N may be calculated as follows:

Adjusted Score($N$)=Initial Score($N$)+$W$(Initial Score ($N-1$)+Initial Score($N+1$)), (Equation 1)

where W is the weighting factor, where Initial Score (N) is the initial score for the given vertical calibration point, Initial Score (N−1) is the initial score for the immediately preceding adjacent vertical calibration point, and wherein Initial Score (N+1) is the initial score for the immediately following vertical calibration point. The weighting factor W may be a variably programmable value. In one embodiment, the programmable weight may fall within a range of 0.125 to 1.0.

Table 1 below illustrates the results of an exemplary calibration, in terms of initial scores and adjusted scores, with comments.

TABLE 1

| Calibration Point | Initial Score | Adjusted Score | Comments |
| --- | --- | --- | --- |
| 0 | 20.00 | 70.00 | Only one neighbor, immediately following |
| 1 | 100.00 | 155.00 | Max Initial Score, but not Max Adjusted score |
| 2 | 90.00 | 180.00 | Max Adjusted Score even though not Max initial Score |
| 3 | 80.00 | 160.00 | Second highest Adjusted Score |
| 4 | 70.00 | 140.00 | |
| 5 | 60.00 | 120.00 | |
| 6 | 50.00 | 100.00 | |
| 7 | 40.00 | 65.00 | Only one neighbor, immediately preceding |

TABLE 1-continued

In the example given by Table 1, there are eight vertical calibration points, although this number may vary from one embodiment to the next. The weighting factor W (from Equation 1) in this particular example is 0.5, while only immediately adjacent neighbor vertical calibration points are used for weighting. As shown in Table 1, although vertical calibration point 1 has the highest initial score, it is vertical calibration point 2 that has the highest adjusted score. This is due to the relatively high initial scores of its neighbors that are weighted into the adjusted score calculation.

Based on having the highest adjusted score, vertical calibration point 2 may be selected by score calculation circuit 212 as the operating point for the memory subsystem upon completion of the calibration procedure. Responsive to selecting a vertical calibration point as the subsequent operating point, score calculation circuit 212 may provide information regarding the delay and the reference voltage associated with the vertical calibration point to calibration circuit 215. Thereafter, calibration circuit 215 may set the operational reference voltage and operational delay values using the RefVCtrl and Delay_Ctl signals, respectively. The RefVCtrl signal may be provided by calibration circuit 215 to reference voltage generator 35, which in turn provides the corresponding reference voltage to receiver 22. The Dly_ctl signal may be provided to delay circuit 30, which may set the corresponding delay that is provided to the data strobe signals.

Calibration circuit 215 in the embodiment shown may assert an update signal, 'Update', at the beginning of a calibration. This update signal, when received as asserted, may signal to the eye calculation circuit 211 that the eye pattern is to be re-calculated for each of the vertical calibration points.

The use of adjusted (neighborhood) scores may result in more reliable operational points. In some cases, an eye pattern may have discontinuities or irregularities due to factors such as reflections. Such discontinuities may in some cases cause errors in reading data. Using the neighborhood score methodology disclosed herein may reduce the chance that read errors occur. In particular, the selected vertical calibration point from this methodology may ensure that the neighboring vertical calibration points are of good quality in addition to the selected point. As such, variations that occur during operation are less likely to adversely affect the reading of data.

It is noted that while the functions performed by calibration control unit 21 have been described as having been carried out by circuitry, embodiments are possible and contemplated in which at least some of the functions are carried out by software and/or firmware. It is further noted that while both read data strobe and write data strobe signals have been disclosed, the discussion below focuses on a singular data strobe signal. This singular data strobe signal may be interpreted as the read data strobe or the write data strobe. Furthermore, the methodology discussed herein may apply to either of the data strobe signals disclosed herein, and the circuitry for performing the same may be reconfigured to reflect such embodiments.

Figure 4:
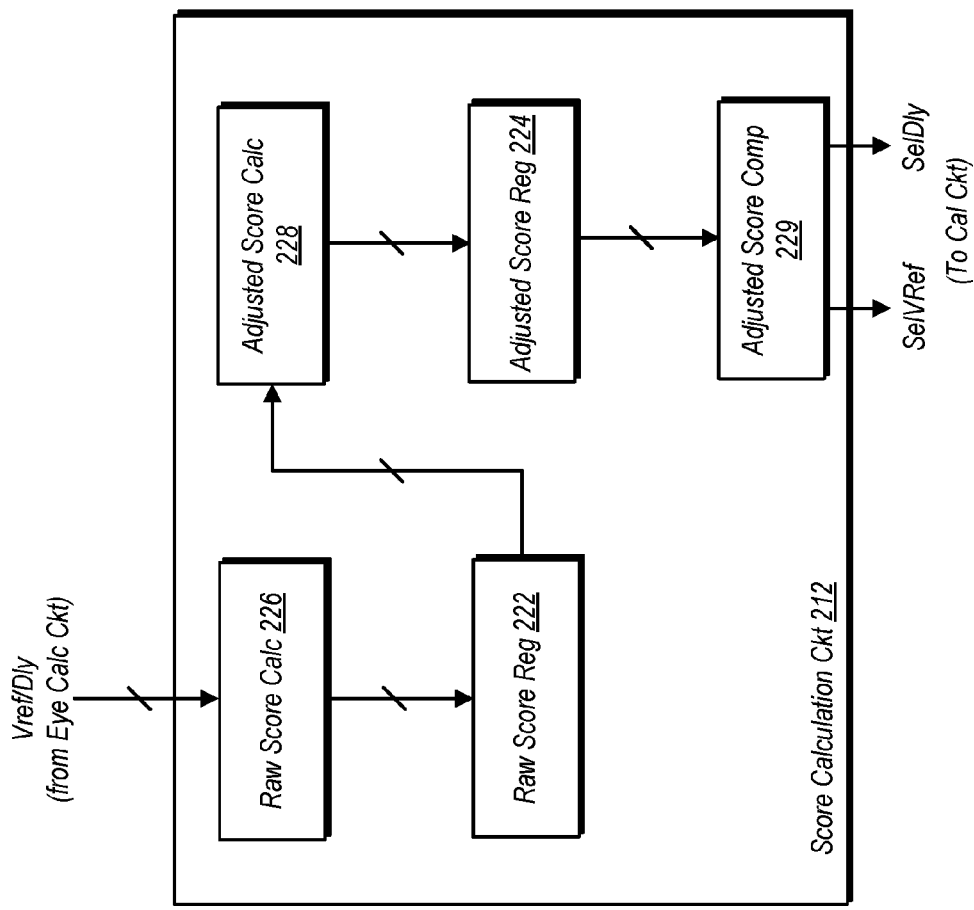
FIG. 4 is a block diagram illustrating further details for one embodiment of a calibration control unit.

Turning now to FIG. 4, a block diagram of one embodiment of score calculation circuit 212 is shown. In the embodiment shown, a raw score calculator 226 is coupled to receive reference voltage and delay data from the eye calculation circuit. The reference voltage information may include information regarding the horizontal width (i.e. a range of delay values) for which data can be correctly read at a particular reference voltage. In some embodiments, this information may be provided on a bit-by-bit basis, while in other embodiments, this information may be a composite for all data bits (e.g., an average). Using this information, a raw score (or initial score as referred to above) may be calculated for each vertical calibration point. These raw scores, along with the associated reference voltage and delay information, may be recorded and stored in raw score register 222.

Adjusted score calculation circuit 228 in the embodiment shown may access the raw scores from register 222. Using the raw scores, adjusted scores for each of the vertical calibration points may be calculated. The adjusted scores may be calculated using variations of Equation 1 given above, using one or more programmable weighting factors. The results of the adjusted score calculations may be stored in adjusted score register 224.

Adjusted score comparison circuit 229 may read the adjusted scores in adjusted score register 224 and determine which is the largest. In one embodiment, adjusted score comparator may begin by reading two adjusted scores and comparing them against one another. The high score of the first comparison may be compared to another adjusted score. After each comparison, the high adjusted score resulting therefrom may be compared to the next adjusted score read from adjusted score register 224. This process may continue until all adjusted scores have been read. Upon determining the maximum adjusted score, adjusted score comparator 229 may cause information regarding the reference voltage and the delay associated with the vertical calibration point having the maximum score to be sent the calibration circuit. Thereafter, the calibration circuit may set the operational reference voltage and operational delay in accordance with the values sent my adjusted score comparator 229.

It is noted that the comparison methodology described above is only one possible embodiment. Embodiments implementing other types of comparison mechanisms for determining a maximum adjusted score are possible and contemplated.

Figure 5:
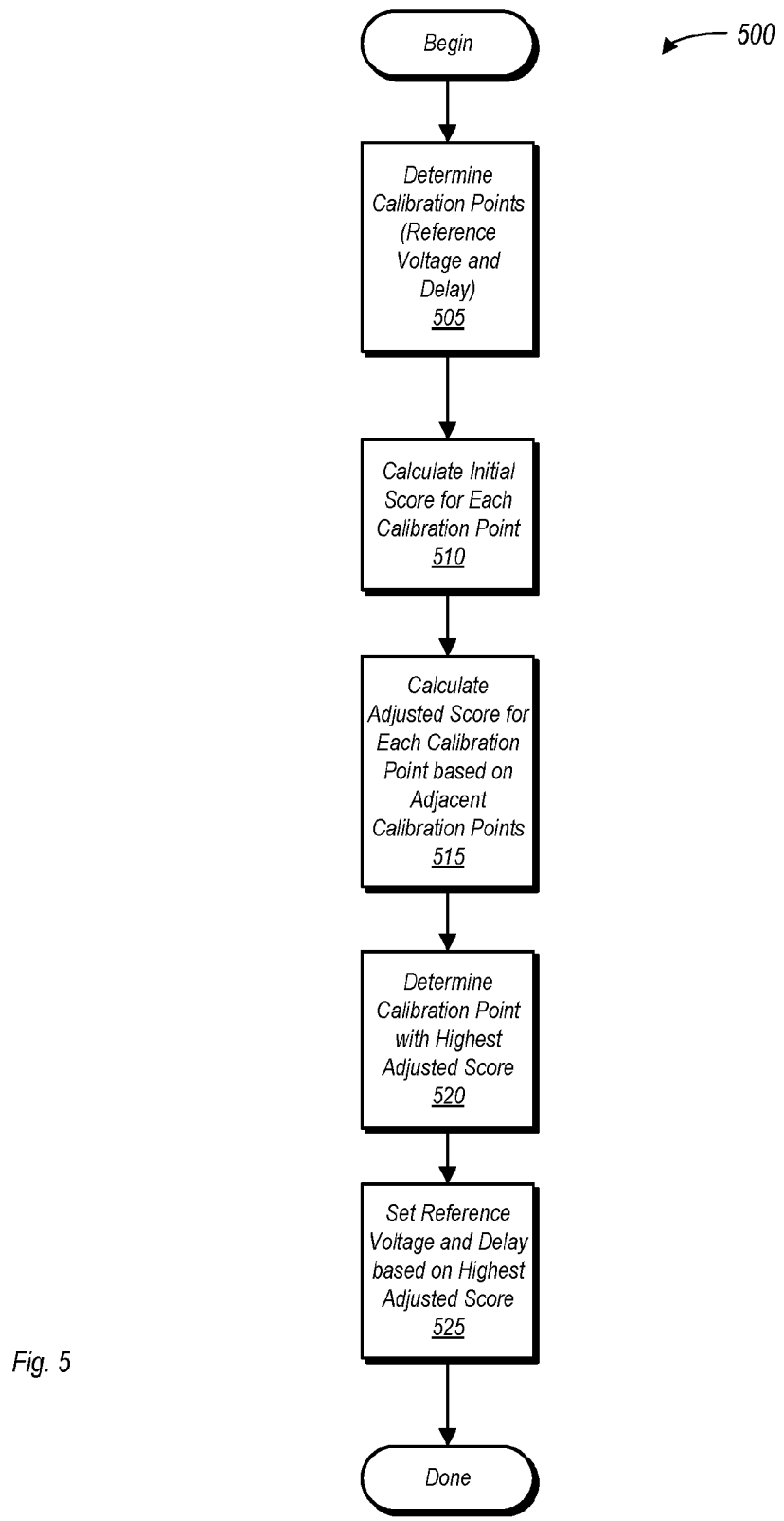
FIG. 5 is a flow diagram illustrating one embodiment of a method for performing calibrations of a memory subsystem.

FIG. 5 is a flow diagram illustrating one embodiment of a method for performing periodic calibrations of a memory subsystem. Method 500 as shown herein may be performed by various embodiments of the hardware discussed above. Other hardware embodiments that perform method 500 are also possible and contemplated, and thus fall within the scope of this disclosure. Furthermore, embodiments where at least some of the functions are performed by software are also possible and contemplated.

Method 500 begins with the determination of a number of different vertical calibration points (block 505). In particular, determining the vertical calibration points includes determining the horizontal width of the eye at a given value of a reference voltage. After determining the information associated with the vertical calibration points, an initial score may be calculated for each (block 510). The initial score (or raw score) may be based on the horizontal width of the eye (the range of delay values) for which data can be validly read at a given value of reference voltage.

Responsive to the calculation of the initial score for each vertical calibration point, adjusted scores may be calculated based on adjacent (or neighboring) vertical calibration points, as explained above (block 515). The calculated adjusted scores may be then compared to each other to determine the highest adjusted score (block 520). Based on the highest adjusted score, the reference voltage and delay values of the corresponding vertical calibration point may be used as the operational values for these parameters (block 525) at least until the next calibration cycle.

Figure 6:
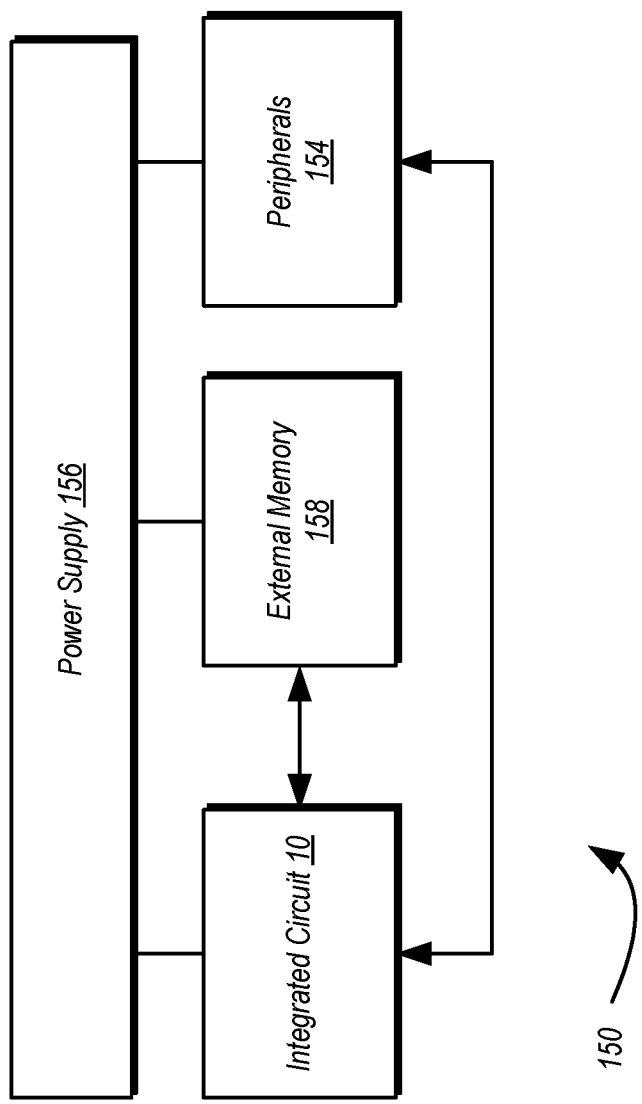
FIG. 6 is a block diagram of one embodiment of an exemplary system.

Turning next to FIG. 6, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. An apparatus comprising:
   a memory;
   a memory controller coupled to the memory, wherein the memory controller is configured to convey a data strobe signal to the memory during transfers of data between the memory and the memory controller, wherein the memory controller includes a calibration control unit configured to:
   perform a calibration of eye openings for signals conveyed between the memory and the memory controller, wherein the calibration includes determining a plurality of calibration points, wherein the eye opening comprises a range of delays of the data strobe signal and a range of reference voltages, wherein a given reference voltage is used to distinguish between a logic zero and a logic one read from the memory;

compute an initial score for each of the plurality of calibration points;

compute an adjusted score for each of the plurality of calibration points, wherein the adjusted score for each of the plurality of calibration points includes a weighting based on one or more adjacent ones of the plurality of calibration points; and select one of the plurality of calibration points having a highest adjusted score as a final calibration result for the calibration.

2. The apparatus as recited in claim 1, wherein a memory subsystem comprising the memory and memory controller is configured to operate, subsequent to the calibration, at the selected one of the plurality of calibration points.

3. The apparatus as recited in claim 1, wherein the initial score is based on a width of an eye opening for one or more data signals received from memory.

4. The apparatus as recited in claim 1, wherein the calibration control unit is configured to, during the calibration, cause the memory controller to perform a plurality of writes of data to the memory and a plurality of reads of data from memory.

5. The apparatus as recited in claim 1, wherein the calibration control unit is configured to compute the adjusted score for a given one of the plurality of calibration points by adding weighted scores for the one or more adjacent ones of the plurality calibration points to the initial score of the given one of the plurality of calibration points.

6. The apparatus as recited in claim 5, wherein computing weighted scores for the one or more adjacent ones of the plurality of calibration points comprises multiplying initial scores for each of the one or more adjacent ones of the plurality of calibration points by a weighting factor.

7. The apparatus as recited in claim 1, wherein the calibration control unit includes:

an eye calculation circuit configured to calculate parameters for eye openings during the calibration;

a score calculation circuit configured to calculate initial and adjusted scores for each of the plurality of calibration points; and a calibration circuit configured to set reference voltage and data strobe delay values for each iteration of the calibration.

8. A method comprising:

performing, using a calibration circuit, calibration of eye openings for signals conveyed between a memory and a memory controller in a memory subsystem, wherein calibrating the eye opening includes determining a plurality of calibration points, wherein each of the calibration points includes a corresponding one of a plurality of reference voltage values and a corresponding one of a plurality of different values of delay applied to a data strobe signal conveyed from the memory controller to the memory, wherein each reference voltage value corresponds to a voltage value used to distinguish between a logic zero and a logic one;

computing an initial score for each of the plurality of calibration points;

computing an adjusted score for each of the plurality of calibration points, wherein the adjusted score for each of the plurality of calibration points includes a weighting base on one or more adjacent ones of the plurality of calibration points; and selecting a one of the plurality of calibration points having a highest adjusted score as a final calibration result for a current calibration cycle.

9. The method as recited in claim 8, wherein performing a calibration of the data strobe delay comprises the calibration circuit causing writes to and reads from memory to be performed at different values of delay, and wherein performing calibration of the reference voltage comprises the calibration circuit causing writes to and reads from memory to be performed at different values of the reference voltage.

10. The method as recited in claim 8, wherein the signals are data signals conveyed from the memory to the memory controller.

11. The method as recited in claim 8, further comprising computing the adjusted score for a given one of the plurality of calibration points by adding weighted scores for the one or more adjacent ones of the plurality calibration points to the initial score of the given one of the plurality of calibration points.

12. The method as recited in claim 11, wherein computing weighted scores for the one or more adjacent ones of the plurality of calibration points comprises multiplying initial scores for each of the one or more adjacent ones of the plurality of calibration points by a weighting factor.

13. The method as recited in claim 8, further comprising operating the memory subsystem at the one of the plurality of calibration points having the highest adjusted score.

14. A system comprising:

a memory subsystem including a memory and a memory controller, wherein the memory controller is configured to synchronize data transfers to and from the memory using a data strobe signal, and wherein the memory controller includes a calibration unit configured to:

calibrate a delay applied to the data strobe signal and a reference voltage used to distinguish between a logic one and a logic zero in order to determine eye openings for signals conveyed between the memory and the memory controller, wherein the calibration includes determining a plurality of calibration points;

compute an initial score for each of the plurality of calibration points;

compute an adjusted score for each of the plurality of calibration points, wherein the adjusted score for each of the plurality of calibration points includes a weighting based on one or more adjacent ones of the plurality of calibration points; and select one of the plurality of calibration points having a highest adjusted score as a final calibration result for the calibration.

15. The system as recited in claim 14, wherein the calibration control unit is configured to:

multiply, by a weighting factor, initial scores for one or more of the plurality of calibration points that are adjacent to a given one of the plurality of calibration points to obtain one or more corresponding weighted scores;

compute the adjusted score for the given one of the plurality of calibration points by adding the initial score for the given one of the plurality of calibration points to the one or more weighted scores.

16. The system as recited in claim 14, wherein the calibration control unit includes:

an eye calculation circuit configured to calculate parameters for eye openings during the calibration;

a score calculation circuit configured to calculate initial and adjusted scores for each of the plurality of calibration points; and a calibration circuit configured to set reference voltage and data strobe delay values for each iteration of the calibration.

17. The system as recited in claim 14, wherein the calibration control unit is configured to, during the calibration, cause the memory controller to perform a plurality of writes of data to the memory and a plurality of reads of data from memory.

18. The system as recited in claim 14, wherein the memory subsystem is configured to operate, subsequent to the calibration, at the selected one of the plurality of calibration points.

* * * * *